United States Patent
Zhang et al.

(10) Patent No.: US 11,133,829 B2
(45) Date of Patent: *Sep. 28, 2021

(54) COMMUNCIATION METHOD USING POLAR CODE, AND WIRELESS DEVICE

(71) Applicant: HUAWEI TECHNOLOGIES CO.,LTD., Guangdong (CN)

(72) Inventors: Huazi Zhang, Hangzhou (CN); Rong Li, Hangzhou (CN); Gongzheng Zhang, Hangzhou (CN); Chen Xu, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/805,701

(22) Filed: Feb. 29, 2020

(65) Prior Publication Data

US 2020/0274553 A1   Aug. 27, 2020

Related U.S. Application Data

(63) Continuation of application No. 16/391,327, filed on Apr. 23, 2019, now Pat. No. 10,581,463, which is a (Continued)

(30) Foreign Application Priority Data

Jun. 27, 2017   (CN) .......................... 201710503568.9

(51) Int. Cl.
   *G11B 20/18*   (2006.01)
   *G06F 12/0866*   (2016.01)
   (Continued)

(52) U.S. Cl.
   CPC .......... *H03M 13/13* (2013.01); *H04L 1/0013* (2013.01); *H04L 1/0041* (2013.01);
   (Continued)

(58) Field of Classification Search
   CPC .... H03M 13/13; H04L 1/0013; H04L 1/0041; H04L 1/0057; H04L 1/0061; H04L 25/0204
   See application file for complete search history.

(56) References Cited

U.S. PATENT DOCUMENTS 9,641,198 B2   5/2017  Jeong et al.
10,581,463 B2 *  3/2020  Zhang ................... H03M 13/13
   (Continued)

FOREIGN PATENT DOCUMENTS

CN   103414540 A   11/2013
CN   106100795 A   11/2016
   (Continued)

OTHER PUBLICATIONS

NEC,"Design of assistance bit aided polar codes for NR control channel",3GPP TSG RAN WG1 Meeting #89, R1-1709497, Hangzhou, China, May 15-19, 2017, total 4 pages.
(Continued)

*Primary Examiner* — Guy J Lamarre
(74) *Attorney, Agent, or Firm* — Conley Rose, P.C.

(57) ABSTRACT

Embodiments of the present invention provide a coding method, where the coding method includes: obtaining, based on a puncturing/shortening proportion P' and a prestored sequence S', a constructed sequence S that has a length equal to a target code length M, where S' includes N' channel indexes sorted by channel reliability or channel capacity, and sorting of channel indexes in S is the same as or different from sorting of channel indexes in S'; and mapping a to-be-sent bit sequence to a channel corresponding to S. According to this method, an appropriate constructed sequence S may be generated based on different puncturing/shortening proportions to perform coding, thereby decreasing a bit error rate.

18 Claims, 7 Drawing Sheets

Related U.S. Application Data continuation of application No. PCT/CN2018/093030, filed on Jun. 27, 2018.

(51) Int. Cl.
  *G06F 11/07*     (2006.01)
  *G11B 20/12*     (2006.01)
  *H03M 13/13*     (2006.01)
  *H04L 1/00*      (2006.01)
  *H04L 25/02*     (2006.01)

(52) U.S. Cl.
  CPC .......... *H04L 1/0057* (2013.01); *H04L 1/0061* (2013.01); *H04L 25/0204* (2013.01)

(56) References Cited

U.S. PATENT DOCUMENTS

| | | |
|---|---|---|
| 2016/0241355 A1 | 8/2016 | Mahdavifar et al. |
| 2017/0012739 A1 | 1/2017 | Shen et al. |
| 2018/0026663 A1 | 1/2018 | Wu et al. |
| 2018/0331697 A1* | 11/2018 | Lin .................. H03M 13/6502 |

FOREIGN PATENT DOCUMENTS

| | | |
|---|---|---|
| CN | 106817195 A | 6/2017 |
| CN | 106877973 A | 6/2017 |
| CN | 107342846 A | 11/2017 |
| JP | 2019518388 A | 6/2019 |
| WO | 2015139297 A1 | 9/2015 |
| WO | 2017215494 A1 | 12/2017 |

OTHER PUBLICATIONS

Huawei, HiSilicon,"Analysis of the sequence of polar codes",3GPP TSG RAN WG1 Meeting #89, R1-1708157, Hangzhou, China, May 15-19, 2017, total 9 pages.

Huawei et al, Polar code design and rate matching. 3GPP TSG RAN WG1 Meeting #86 Gothenburg, Sweden, Aug. 22-26, 2016, R1-167209, 5 pages.

ZTE: "Polar Codes Contruction and Rate Matching Scheme", 3GPP Draft; R1-1707183, vol. RAN WG1, No. Hangzhou, China; May 15, 2017-May 19, 2017, May 7, 2017, XP051262938, 13 pages.

Mediatek Inc: "Polar Code Size and Rate-Matching Design for NR Control Channels", 3GPP Draft; R1-1702735, vol. RAN WG1, No. Athens, Greece; Feb. 13, 2017-Feb. 17, 2017, Feb. 7, 2017, XP051221575, 8 pages.

Qualcomm Incorporated,Rate-matching scheme for control channel,3GPP TSG-RAN WG1 NR Ad-Hoc#2, R1-1711220, Jun. 27-30, 2017, Qingdao, P. R. China, total 6 pages.

Qualcomm Incorporated,Rate-matching scheme for polar codes and performance evaluation, R1-1708647, 3GPP TSG-RAN WG1 #89, May 15-19, 2017, Hangzhou, P. R. China, total 4 pages.

* cited by examiner

COMMUNCIATION METHOD USING POLAR CODE, AND WIRELESS DEVICE

CROSS-REFERENCE TO RELATED APPLICATIONS

This application is a continuation of U.S. patent application Ser. No. 16/391,327, filed on Apr. 23, 2019, which is a continuation of International Application No. PCT/CN2018/093030, filed on Jun. 27, 2018. The International Application claims priority to Chinese Patent Application No. 201710503568.9, filed on Jun. 27, 2017. All of the aforementioned patent applications are hereby incorporated by reference in their entireties.

TECHNICAL FIELD

This application relates to wireless communication field, especially relates to a channel coding method and device.

BACKGROUND

Communication systems use channel coding to improve reliability of data transmission and ensure communication quality. Polar code is a coding manner that can theoretically achieve Shannon capacity and that has simple encoding and decoding algorithms. A polar code is a type of linear block code. A generator matrix of the polar code is $G_N$, and a coding process of the polar code is:

$$x_1^N = u_1^N G_N$$

where $x_1^N$ is an N-bit output sequence of the coding process, $u_1^N = (u_1, u_2, K, u_N)$ is an N-bit binary row vector, $N=2^n$ is a mother code length, n is a positive integer, K is a quantity of information bits ($K \leq N$), $G_N$ is a N row×N column matrix, $G_N = F_2^{\otimes(\log_2(N))}$. $F_2$ is a 2×2 matrix $$F_2 = \begin{bmatrix} 1 & 0 \\ 1 & 1 \end{bmatrix}.$$

$F_2^{\otimes(\log_2(N))}$ is a Kronecker product of $F_2$, and $F^{\otimes(\log_2(N))} = F \otimes F^{\otimes((\log_2(N))-1)}$).

During a polar coding process, some bits in $u_1^N$ are used to carry information, and these bits are referred to as information bits. In $u_1^N$, each bit has a sequence number (or called index). A set of sequence numbers of the information bits is denoted as A. Other bits in $u_1^N$ are set to a fixed value that is pre-agreed upon between a receive end (receiving device) and a transmit end (transmitting device), and they are referred to as fixed bits. A set of sequence numbers of the fixed bits is represented by a complementary set $A^c$ of A. Without loss of generality, the fixed bits are usually set to zero. Actually, as long as the receive end and the transmit end pre-agree with each other, the fixed bits can be set to any value. Therefore, a coded bit sequence, i.e. a polar code, may be obtained by using $x_1^N = u_A G_N(A)$, where $u_A$ is a set of information bits in $u_1^N$, and $u_A$ is a row vector having a length of K. In other words, $|A|=K$, where $|\cdot|$ indicates a quantity of elements in a set, and K indicates a quantity of elements in the set A. $G_N(A)$ is a submatrix of $G_N$, and $G_N(A)$ is obtained by taking K rows of $G_N$ corresponding to K indexes of the information bits in the set A. $G_N(A)$ is a matrix of K rows×N columns.

Several polar coding schemes have been developed based on the above basic polar coding process. For example, by using a CRC (Cyclic Redundancy Check)-aided enhanced SC (successive cancellation) decoding algorithm, the polar code may achieve FER (false alarm ratio) performance superior to low density parity check (LDPC) and Turbo codes.

In the prior art, to support all combinations of code lengths and code rates required by a system, a large quantity of mother code sequences need to be stored, and therefore storage overheads of the system can be very large.

SUMMARY

This application provides a coding method, a wireless device, and a chip, so as to decrease storage overheads of a system.

According to a first aspect, this application provides a coding method. The method includes: obtaining input to-be-coded bits; performing polar coding on the to-be-coded bits to obtain a polar-coded bit sequence; obtaining, based on a puncturing/shortening proportion P' and a prestored sequence S', a constructed sequence S that has a length equal to a target code length M, where S' includes N' channel indexes sorted by channel reliability or channel capacity, and sorting of channel indexes in S is the same as or different from sorting of channel indexes in S; and mapping the polar-coded bit sequence to a channel corresponding to S.

According to a second aspect, this application provides a wireless device. The wireless device includes at least a memory and an encoder, where the memory is configured to store a relationship between a puncturing/shortening proportion P' and a sequence S'; and the encoder is configured to: obtain an input to-be-coded bit sequence by using an interface; perform polar coding on the to-be-coded bit sequence to obtain a polar-coded bit sequence, and obtain, based on the puncturing/shortening proportion P' and the sequence S', a constructed sequence S that has a length equal to a target code length M, where S' includes N' channel indexes sorted by channel reliability or channel capacity, and sorting of channel indexes in S is the same as or different from sorting of channel indexes in S'; and map a to-be-transmitted bit sequence to a channel corresponding to S.

According to a third aspect, this application provides a chip, where the chip includes an interface and an encoder, where the encoder is configured to obtain an input to-be-coded bit sequence by using the interface; and the encoder is further configured to: perform polar coding on the to-be-coded bit sequence to obtain a polar-coded bit sequence, and obtain, based on a preset puncturing/shortening proportion P' and a sequence S', a constructed sequence S that has a length equal to a target code length M, where S' includes N' channel indexes sorted by channel reliability or channel capacity, and sorting of channel indexes in S is the same as or different from sorting of channel indexes in S'; and map the polar-coded bit sequence to a channel corresponding to S.

According to a fourth aspect, this application further provides a computer storage medium, where the storage medium stores program code. When being executed by a computer or a processor, the program code is used to perform the following steps:

obtaining input to-be-coded bits;

performing polar coding on the to-be-coded bits to obtain a polar-coded bit sequence;

obtaining, based on a puncturing/shortening proportion P' and a prestored sequence S', a constructed sequence S that has a length equal to a target code length M, where S' includes N' channel indexes sorted by channel reliability or channel capacity, and sorting of channel indexes in S is the same as or different from sorting of channel indexes in S'; and mapping the polar-coded bit sequence to a channel corresponding to S.

According to a fifth aspect, this application further provides a computer program product, where the computer program product includes the foregoing program code, and the computer program product may be stored in the storage medium according to the fourth aspect or may be stored on a server, for download by a user.

According to the technical solutions provided in this application, a constructed sequence that is suitable for various puncturing/shortening proportions may be generated, and channel reliability sorting in the constructed sequence is more appropriate, thereby decreasing a bit error rate.

BRIEF DESCRIPTION OF DRAWINGS

The following briefly describes the accompanying drawings used in describing the embodiments of the present application.

DETAILED DESCRIPTION OF EMBODIMENTS

The following describes the technical solutions in the embodiments of the present application with reference to the accompanying drawings.

The technical solution in the embodiments of the present application may be applied in various communications systems. Examples of the communications systems include Global System for Mobile Communications (GSM) system, Code Division Multiple Access (CDMA) system, Wideband Code Division Multiple Access (WCDMA) system, general packet radio service (GPRS) system, Long Term Evolution (LTE) system, LTE frequency division duplex (FDD) system, LTE time division duplex (TDD) system, and Universal Mobile Telecommunications System (UMTS). In addition, the technical solution in the embodiments of the present application may also be applied in various fifth generation (5G) communication systems currently in development, and future communication systems. Generally, systems where information or data is encoded/decoded using a conventional Turbo code or a LDPC code may also use the polar coding method as provided in the embodiments of the present application.

Figure 1:
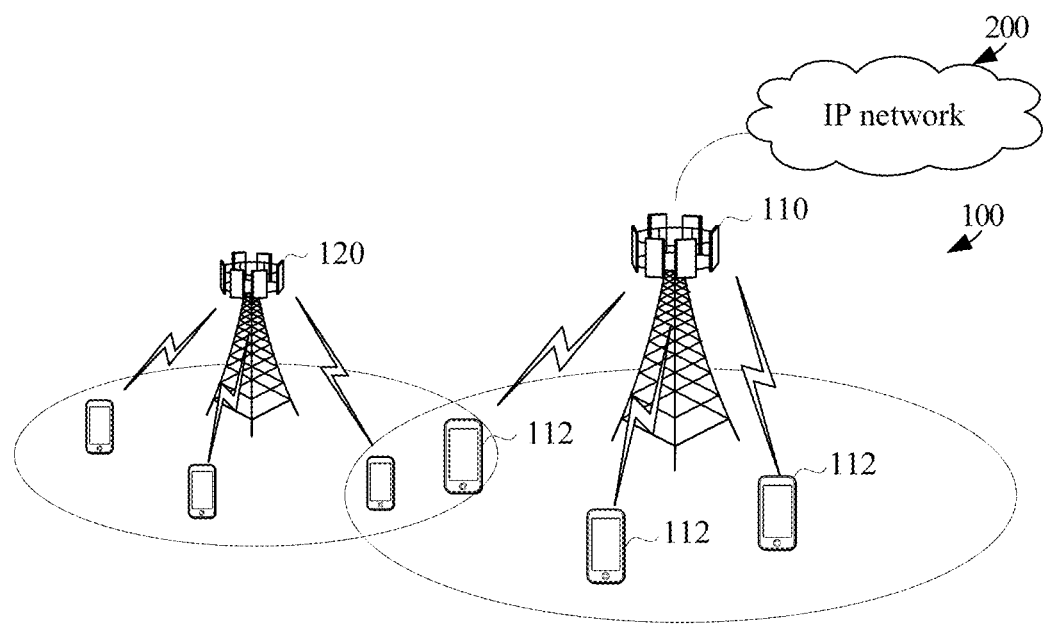
FIG. 1 is a schematic diagram of a wireless communication network in which embodiments of the present application may be implemented.

As shown in FIG. 1 for example, a wireless communication network 100 includes a network device 110 and a terminal 112. The network device 110 may be connected to a core network. The network device 110 may communicate with an internet protocol (IP) network 200, such as the Internet, a private IP network, or other data networks. A network device provides a service for a terminal in a coverage area of the network device. For example, as shown in FIG. 1, the network device 110 provides radio access for one or more terminals 112 in a coverage area of the network device 110. In addition, coverage areas of network devices may overlap. For example, coverage area of the network device 110 and coverage areas of another network device 120 may overlap. Network devices may communicate with each other, for example, the network device 110 and the network device 120 may communicate with each other.

A network device may be a device configured to communicate with a terminal device. For example, the network device may be a base transceiver station (BTS) in a GSM system or a CDMA system, a NodeB (NB) in a WCDMA system, an evolved NodeB (eNB or eNodeB) in an LTE system, or a network-side device in a future 5G network. The network device may further be a repeater station, an access point, an in-vehicle device, or the like. In a device-to-device (D2D) communication system, the network device may be a terminal that functions as a base station.

The terminal may be user equipment (UE) device, an access terminal, a subscriber unit, a mobile station, a remote station, a remote terminal, a mobile device, a user terminal, a wireless communication device, a user agent, or a user apparatus. The access terminal may be a cellular phone, a cordless telephone set, a Session Initiation Protocol (SIP) phone, a wireless local loop (WLL) station, a personal digital assistant (PDA), a handheld device or a computing device having a wireless communication function, a processing device connected to a wireless modem, an in-vehicle device, a wearable device, a terminal device in a future 5G network, or the like.

Figure 2:
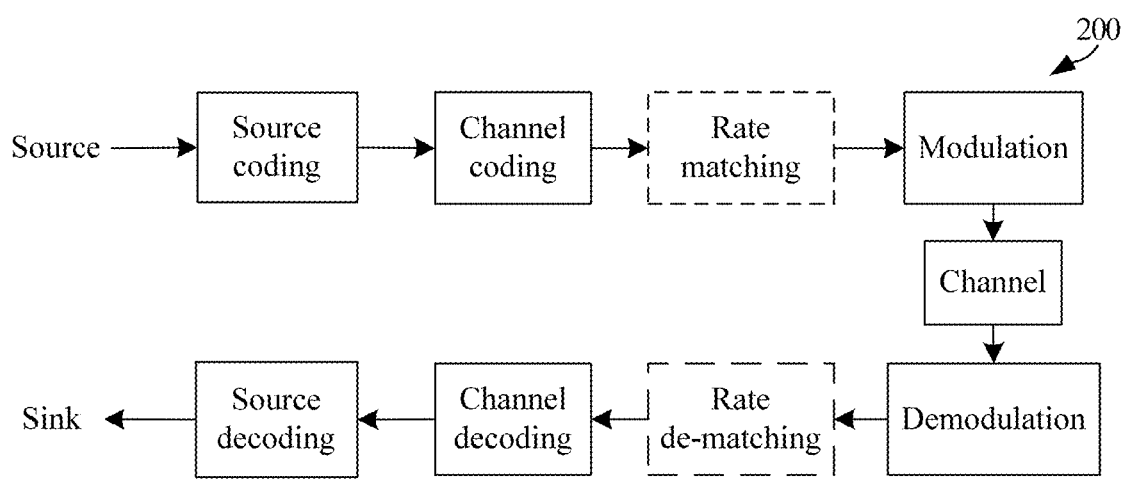
FIG. 2 is a schematic diagram of a channel encoding and decoding procedure.

When the network device communicates with the terminal, the network device/terminal needs to encode to-be-transmitted data/information and decode received data/information according to a procedure shown in FIG. 2. For ease of description, the network device and the terminal are collectively referred to as a wireless device in the following description.

As shown in FIG. 2, after obtaining the to-be-transmitted data/information (which may also be referred to as a source), the wireless device sequentially performs source coding, channel coding, rate matching, and modulation, and sends the processed data/information on a channel as a signal. After receiving the signal, a wireless device at a peer end obtains final data/information (which may also be referred to as a sink) after sequentially performing demodulation, rate de-matching, channel decoding, and source decoding.

The embodiments of the present application pertain to channel coding, which is described in the following by using specific examples. It may be learned, according to the description in the Background section of this application, that in a polar coding process, a mother code length N is obtained, but the mother code length N may not match a target code length M, which equals to a quantity of actually available physical subchannels. Therefore, a rate matching process, which changes an output sequence of N bits to a rate matched sequence of M bits, needs to be performed after the polar coding. Currently, two types of rate matching methods can be used: puncturing and shortening. An objective of the puncturing or shortening is to remove some bits from a to-be-transmitted bit sequence, so that the actually transmitted bit sequence matches carrying capability of the physical channel.

To improve polar code performance, in the polar code, K bit positions are selected from the N-bit binary row vector, to carry information bits (or information bits and CRC bits). The K bit positions, represented by K sequence numbers or channel indexes, correspond to K most reliable subchannels. Optimal decoding performance is ensured because the information bits (or information bits and CRC bits) are transmitted in the most reliable subchannels. Channel indexes in an N-bit mother code sequence are sorted by reliability. If there is no rate matching, the channel indexes corresponding to the K most reliable subchannels may be easily selected from the mother code sequence for carrying the information bits (or information bits and CRC bits). However, after the rate matching, the mother code sequence that has the length of N becomes a constructed sequence that has a length of M. In this case, after M subchannels, represented by M channel indexes in the constructed sequence, are re-sorted by reliability through emulation, it is found that sorting order of the M subchannels in the constructed sequence may change, compared with the original sorting order in the mother code sequence. In this case, it is probably inaccurate if K most reliable subchannels are selected directly based on the reliability sorting order in the mother code sequence.

Figure 3:
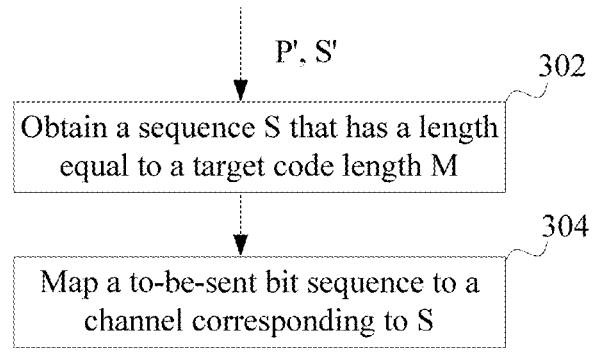
FIG. 3 is a flowchart of an encoding method according to an embodiment of the present application.

To resolve the foregoing problem, as shown in FIG. 3, an embodiment of the present application provides the following method, which is performed by a wireless device.

302. Obtain, based on a puncturing/shortening proportion P' and a prestored sequence S', a constructed sequence S that has a length equal to a target code length M.

The prestored sequence S' includes a quantity N' of channel indexes sorted by channel reliability, and sorting order of channel indexes in the constructed sequence S is the same as or different from sorting order of the channel indexes in the prestored sequence S'.

304. Map to-be-transmitted bits to subchannels corresponding to the constructed sequence S.

If N'=M, the prestored sequence S' is the same as the constructed sequence S, that is, S=S', and the sorting order of the channel indexes in S is the same as the sorting order of the channel indexes in S'.

If N'≠M, the foregoing step 302 may be: first obtaining the prestored sequence S' based on the puncturing/shortening proportion P', and then obtaining, based on the prestored sequence S', a sequence that has a length of M (i.e. the constructed sequence).

For example, if N'>M, the constructed sequence S may be obtained, after N'×P' channels are removed from N' channels corresponding to the prestored sequence S', by adjusting channel indexes of remaining N'×(1−P') subchannels based on a preset adjustment order. The constructed sequence S includes some or all of the channel indexes of the remaining N'×(1−P') subchannels. How to perform adjustment based on the preset adjustment order will be described later.

If N'<M, the constructed sequence S may be an M-bit sequence that is generated based on the prestored sequence S'. For example, an offset N' is added to each channel index in S', to obtain a sequence that has a length of 2N', or a similar method is used to obtain a sequence S" that has a length of N", and N">M. The constructed sequence S may be obtained, after N"×P' subchannels are removed from N" subchannels corresponding to the sequence S", by adjusting channel indexes of remaining N"×(1−P') subchannels based on the preset adjustment order, and the constructed sequence S includes some or all of the channel indexes of the remaining N"×(1−P') subchannels.

A correspondence may exist between the puncturing/shortening proportion P' and the the prestored sequence S'. For example, before performing step 302, the wireless device may prestore the following Table 1. Table 1 includes correspondences between P' and S'. There may be n values of P', namely, $P_0'$ to $P_n'$. Different values of P' correspond to different sequences S', namely, $S_0$ to $S_n$.

The wireless device may obtain a corresponding sequence S' based on the puncturing/shortening proportion P' and by querying Table 1. P' herein indicates an actual puncturing/shortening proportion.

TABLE 1

| Value of P' | Sequence S' |
| --- | --- |
| $P_0'$ | $S_0$ |
| $P_1'$ | $S_1$ |
| $P_2'$ | $S_2$ |
| ... | ... |
| $P_n'$ | $S_n$ |

In another example, the foregoing puncturing/shortening proportion P' may not be an actual puncturing/shortening proportion but an estimated value of a puncturing/shortening proportion, and a plurality of actual puncturing/shortening proportions may correspond to one value of P'. For ease of description, the following uses parameter P to represent the actual puncturing/shortening proportion. For example, the wireless device may alternatively prestore the following Table 2, and Table 2 includes correspondences between P, P', and S'. Values of P have n+1 ranges (referring to column 1 in Table 2, some ranges may be specific values, which, for ease of description, are collectively referred to as ranges). There may be n+1 values of the corresponding P', namely, $P_0'$ to $P_n'$, and different values correspond to different sequences S', namely, $S_0$ to $S_n$. The wireless device may obtain a corresponding sequence S' based on the puncturing/shortening proportion P and by querying Table 2.

TABLE 2

| Value of P in ranges | Value of P' | Sequence S' |
| --- | --- | --- |
| $P_0$ | $P_0'$ | $S_0$ |
| $P_0 < P \leq P_1$ | $P_1'$ | $S_1$ |
| $P_1 < P \leq P_2$ | $P_2'$ | $S_2$ |
| ... | ... | ... |
| $P_{n-1} < P \leq P_n$ | $P_n'$ | $S_n$ |

Certainly, during actual application, simple variations may be made to the foregoing Table 2, for example, the wireless device may store the following Table 3. The value of P' in Table 3 is not an estimated value, but represents a value or a value range of an actual puncturing/shortening proportion.

TABLE 3

| Value of P' | Sequence S' |
| --- | --- |
| P' = P$_0$ | S$_0$ |
| P$_0$ < P' ≤ P$_1$ | S$_1$ |
| P$_1$ < P' ≤ P$_2$ | S$_2$ |
| ... | ... |
| P$_{n-1}$ < P' ≤ P$_n$ | S$_n$ |

The following provides specific examples for ease of understanding.

For example, for a rate matching manner of puncturing, the following Table 4 may be stored. P' in Table 4 represents a puncturing proportion. Various constructed sequences that have a length of M (M has different values) may be constructed by using four sequences S' in Table 4.

TABLE 4

| Value of P' | Sequence S' |
| --- | --- |
| 0 ≤ P' < ¼ | S$_0$ |
| ¼ ≤ P' < ⅜ | S$_{p1}$ |
| ⅜ ≤ P' < 7/16 | S$_{p2}$ |
| 7/16 ≤ P' < ½ | S$_0$ |

For another example, for a rate matching manner of shortening, the following Table 5 may be stored. P' in Table 5 represents an actual puncturing/shortening proportion. Various constructed sequences that have a length of M (M has different values) may be constructed by using three sequences S' in Table 5.

TABLE 5

| Value of P' | Sequence S' |
| --- | --- |
| 0 ≤ P' < ½ | S$_0$ |
| ½ ≤ P' < ⅝ | S$_{s1}$ |
| ⅝ ≤ P' < ½ | S$_0$ |

The sequence S$_0$ in the foregoing table may be a basic sequence. To reduce storage overheads, the wireless device may not need to store a plurality of sequences S'. For example, only the sequence S$_0$ is stored, and other sequences may be generated based on the sequence S$_0$. For example, S$_0$ may be a largest mother code sequence, and other sequences such as S$_{p1}$, S$_{p2}$, or S$_{s1}$ may be extracted from S$_0$ according to a particular order. S$_0$ may alternatively be a short sequence, other sequences may be generated based on S$_0$, and there are a plurality of generation manners. For example, S$_0$ and a short sequence are combined to generate another sequence, or after an offset is added to each channel index in S$_0$, a sequence is constructed by combining the S$_0$ and the offset-added channel indexes. Constructing a sequence is not a focus of the present application, and therefore details are not described further herein.

If the length of the prestored sequence S' is exactly M, rate matching is not needed. Channels used for transmitting K information bits may be selected directly based on S'.

Figure 4:
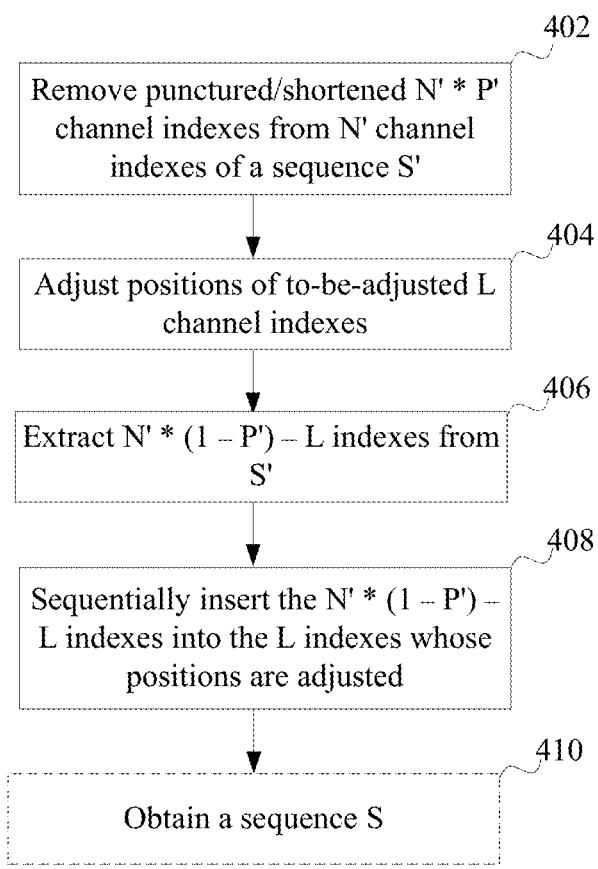
FIG. 4 is a flowchart of a method for adjusting a sequence according to an embodiment of the present application.

If the length of the prestored sequence S' is not equal to M, rate matching is related. For example, if the length of S' is greater than M, a constructed sequence S that has a length of M may be obtained by using a method shown in FIG. 4.

402. Puncture/shorten N'×P' channel indexes from N' channel indexes of S'.

In a specific implementation, the N'×P' channel indexes may be removed, or N'×P' subchannels, whose reliability is decreased to 0 because of the puncturing/shortening, are frozen, or reliability sorting orders of the punctured/shortened N'×P' channel indexes are set to the lowest. For example, channel index values corresponding to N'×P' subchannels are assigned to Q$_1$, ..., Q$_{N'×P'}$, indicating that the N'×P' subchannels have the lowest reliability. Alternatively, the subchannels whose reliability is decreased to zero due to puncturing/shortening are directly frozen.

Figure 5A:
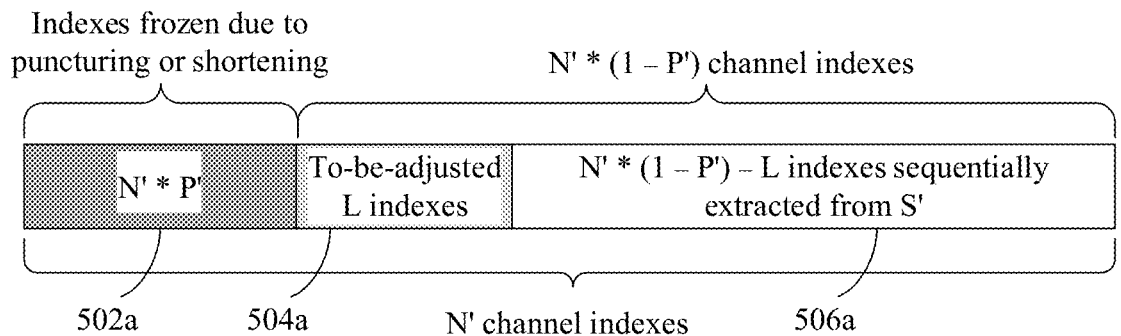
FIG. 5A and FIG. 5B are schematic diagrams of adjusting a sequence, according to an embodiment of the present application.
Figure 5B:
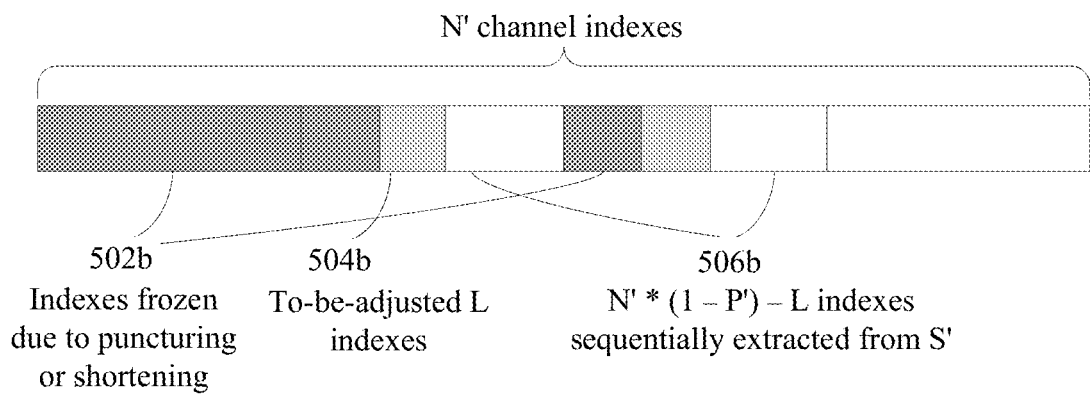

Positions of the foregoing punctured/shortened N'×P' subchannels may be consecutive, as shown in FIG. 5A, block 502*a*. An order of puncturing/shortening may be from beginning to end, or from end to beginning, or channel indexes in several consecutive positions in the middle are punctured/shortened. Positions of the punctured/shortened N'×P' subchannels may alternatively be dispersed, irregularly or regularly. For example, one or more channel indexes are punctured/shortened at an interval of T bits. The positions of the punctured/shortened N'×P' subchannels may be a result subject to both the foregoing two manners. For example, as shown by 502*b* in FIG. 5B, when 0<P≤¼, a consecutive puncturing/shortening manner is used; or when ¼<P≤½, a dispersed puncturing/shortening manner is used. The puncturing/shortening positions shown in FIG. 5A and FIG. 5B are merely examples. In actual applications, a puncturing/shortening position may be a mirror, in a left or right direction with the middle position as an axis, of the position shown in FIG. 5A and FIG. 5B, or may be another position.

If a puncturing proportion is slightly less than ¼, that is, N'×¾<M<β×(N'×¾), an i (<N'/4) part is forcibly frozen, and a corresponding adjustment short sequence is all all zeros, that is, the 504*a* part is not adjusted, where β>1, β=1+1/16, 1+⅛, 1+3/16, ..., or β is a function of K$_0$/M$_0$ or K$_0$/M$_0$. In this case, a quantity of indexes shown by 502*a* plus a quantity of indexes shown by 504*a* in FIG. 5A may be less than or equal to N'/4.

An object of the foregoing puncturing/shortening may be a sequence obtained based on natural sorting by channel index, for example, {1, 2, 3, 4, ..., 512} and {1, 2, 3, 4, ..., 1024}, or may be a sequence after channel indexes are sorted by channel reliability. This is not limited herein.

404. Adjust positions of to-be-adjusted L channel indexes based on an adjustment sequence.

The to-be-adjusted L channel indexes may be consecutive, as shown by 504*a* in FIG. 5A, or the to-be-adjusted L channel indexes may be dispersed, as shown by 504*b* in FIG. 5B. The to-be-adjusted L channel indexes may alternatively be partially consecutive and partially dispersed.

Assuming that the L channel indexes are {X$_1$, X$_2$, ..., X$_L$}, and an adjustment sequence corresponding to the L channel indexes is {a$_1$, a$_2$, ..., a$_{L-1}$, a$_L$}, the positions of the to-be-adjusted L channel indexes are adjusted based on the adjustment sequence, which indicates that, a position of an index X$_1$ needs to be moved a$_1$ positions backward or forward (for example, that a$_1$ is a positive number indicates moving backward; that a$_1$ is a negative number indicates moving forward), a position of an index X$_2$ needs to be moved a$_2$ positions backward or forward, a position of an index X$_{L-1}$ needs to be moved a$_{L-1}$ positions backward or forward, and a position of an index X$_L$ needs to be moved at positions backward or forward.

406. Extract N×(1−P')−L indexes from S'.

If S' is a Q sequence, the N'×(1−P')−L channel indexes may be sequentially extracted from the Q sequence. As shown in FIG. 5A, it is assumed that the length of S' is 512, and channel indexes whose values are 129 to 512 need to be filled in the 506*a* part. In this case, only channel indexes whose index values are 129 to 512 need to be sequentially extracted from the Q sequence that has the length of 512. Sorting order of 129 to 512 channel indexes is consistent with sorting order in the Q sequence (sorting consistency herein means that a relative order of channel indexes is consistent).

Alternatively, as shown in FIG. 5B, it is assumed that the length of S' is still 512, and channel indexes whose values are 192 to 256 and 320 to 512 need to be filled in the 506b part. In this case, only channel indexes whose index values are 192 to 256 and 320 to 512 need to be sequentially extracted from the Q sequence that has the length of 512. Sorting order of 192 to 256 and 320 to 512 channel indexes is consistent with sorting order in the Q sequence (sorting consistency herein means that a relative order of channel indexes is consistent).

Figure 9A:
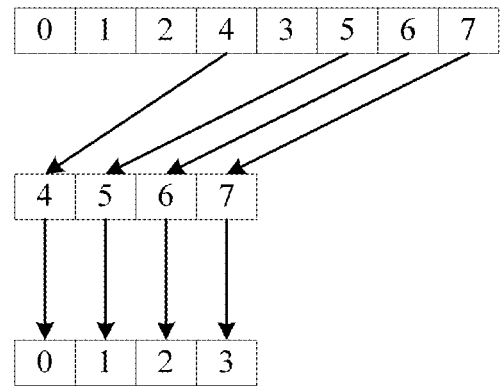
FIG. 9A and FIG. 9B are schematic diagrams of extracting a short sequence from a long sequence, according to an embodiment of the present application.

For example, if the sequence S' is a sequence {0, 1, 2, 4, 3, 5, 6, 7} that has a length of 8, and if N×(1−P')−L=4, N'×(1−P')−L channel indexes, which are {0, 1, 2, 3}, may be extracted, as shown in FIG. 9A.

Figure 9B:
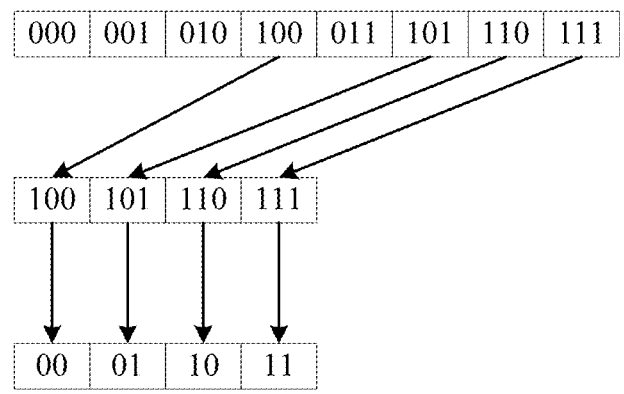

For another example, if the sequence S' is a sequence {0, 1, 2, 4, 3, 5, 6, 7} that has a length of 8 and is expressed in binary, as shown by row 1 in FIG. 9B, and if N×(1−P')−L=4, a manner shown in FIG. 9B may be used to extract a binary index that has a bit equal to a fixed value (for example, a first bit is equal to 1) in each binary index in S'. Specifically, as shown by row 2 in FIG. 9B, the first bit is removed, and an extracted channel index set {00, 01, 10, 11} is formed.

408. Sequentially insert the N'×(1−P')−L indexes into the foregoing L indexes whose positions are adjusted, to obtain a sequence $S_A$.

If S' is a Q sequence, the adjustment sequence is $\Delta Q_i$, and $\Delta Q_i$ includes a position offset of an index in a to-be-adjusted sequence, a wireless device may adjust positions of some of to-be-adjusted indexes based on $\Delta Q_i$. For example, the to-be-adjusted indexes are adjusted to corresponding positions based on the position offset included in $\Delta Q_i$, and then the N'×(1−P')−L indexes are sequentially placed on positions on which the L indexes are not placed, for example, the positions shown by 506a in FIG. 5A or 506b in FIG. 5B.

If S' is a Z sequence, the adjustment sequence is $\Delta Z_i$, and $\Delta Z_i$ includes reliability values of indexes in a to-be-adjusted sequence, the wireless device may adjust the reliability values included in $\Delta Z_i$ to corresponding positions, for example, the reliability values included in $\Delta Z_i$ and reliability values of the foregoing N'×(1−P')−L channels may be re-sorted.

410. Obtain, based on the sequence $S_A$ formed in step 408, a constructed sequence S that has a length of M.

Assuming that a length of $S_A$ is M'=N'×(1−P'), if M'=M, step 410 is not needed, that is, the sequence formed in step 408 is a final sequence S.

If a length M' of $S_A$ is greater than M, the constructed sequence S that has the length of M needs to be further extracted from $S_A$. There are a plurality of manners of extracting the constructed sequence S that has a length of M from $S_A$.

Manner (1): If $S_A$ is a Q sequence, a set of indexes that are extracted from $S_A$ and meet the following condition forms the foregoing constructed sequence S:

$$\mod(Q_i, M'/M) = C,$$

where $Q_i$ is an $i^{th}$ index in $S_A$, 1≤i≤M', C is an integer, and 0≤C<M'/M.

Figure 10A:
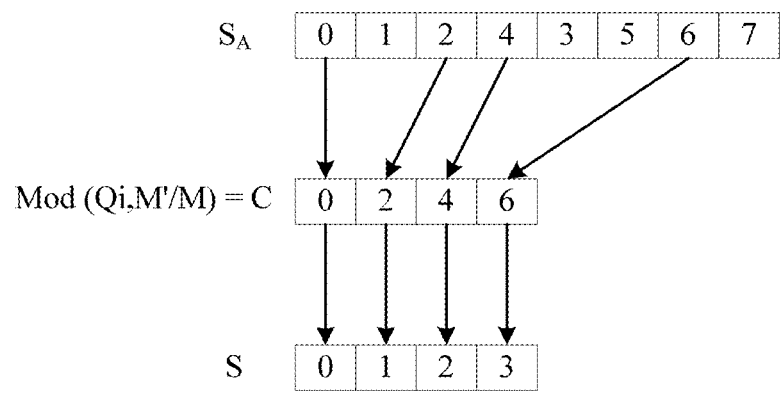
FIG. 10A and FIG. 10B are schematic diagrams of extracting a short sequence from a long sequence, according to an embodiment of the present application.

For example, if $S_A$ is a sequence {0, 1, 2, 4, 3, 5, 6, 7} that has a length of 8, and M=4, a manner shown in FIG. 10A may be used to form the final constructed sequence S, namely, {0,1,2,3}.

Manner (2): If $S_A$ is a Q sequence, and M'/M=$2^x$, the constructed sequence S is formed after indexes in $S_A$ are expressed in binary, and X bits and repeated binary index numbers are removed from $S_A$.

Figure 10B:
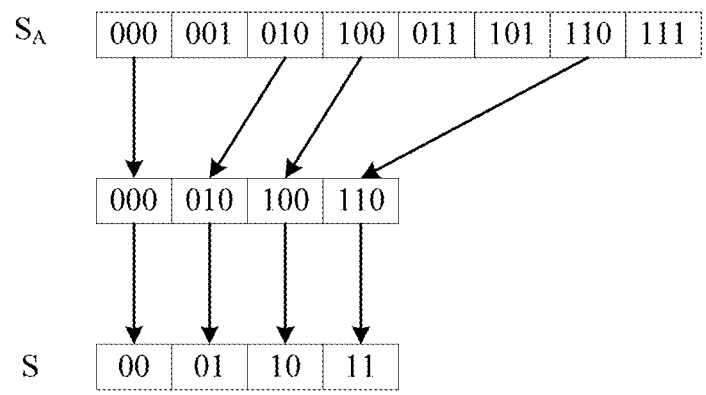

For example, if $S_A$ is a sequence {0, 1, 2, 4, 3, 5, 6, 7} that has a length of 8 and is expressed in binary, as shown by row 1 in FIG. 10B, and if M=4, a manner shown in FIG. 10B may be used to remove a last bit from each binary index in $S_A$ to form the final constructed sequence S, that is, {00, 01, 10, 11}={0, 1, 2, 3}.

Manner (3): If $S_A$ is a Z sequence sorted by reliability, indexes may be extracted with a same spacing from the Z sequence to form the constructed sequence S. For example, assuming that the Z sequence is $\{Z_1, Z_2, \ldots, Z_{M'}\}$, $\{Z_1, Z_3, Z_5, \ldots\}$ may be extracted from the Z sequence to form the constructed sequence S. This example is given merely for ease of understanding. In a specific implementation, a spacing needs to be set based on a value of M or a relationship between M and M'.

Manner (4): If $S_A$ is a Z sequence sorted by reliability, indexes may be extracted with a fixed spacing from the Z sequence to form the constructed sequence S.

For ease of understanding, the following gives specific examples for description.

Figure 6:
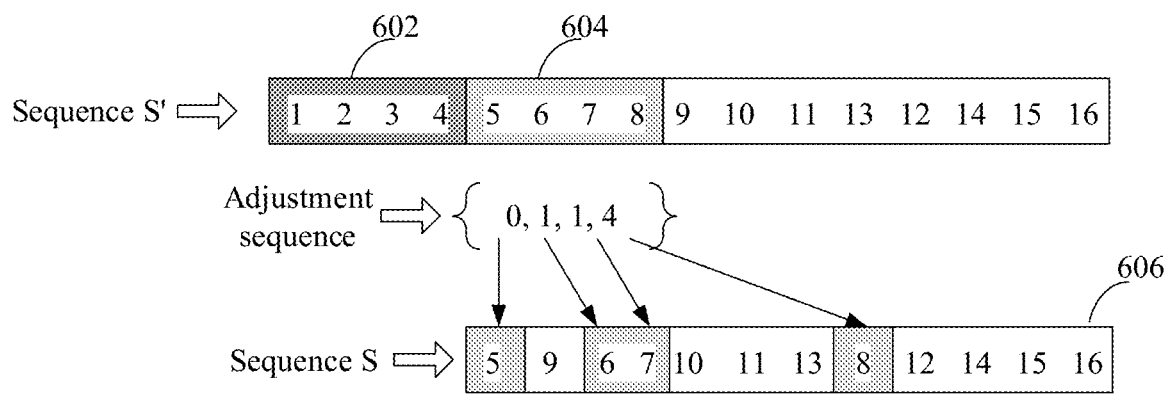
FIG. 6 is a schematic diagram of adjusting a sequence, according to an embodiment of the present application.

As shown in FIG. 6, assuming that the length of S' is 16, as shown in FIG. 6, if the puncturing/shortening proportion P'=¼, it means that four indexes need to be removed from S'. It is assumed that indexes that need to be removed are {1, 2, 3, 4} that is shown by 602 in FIG. 6, indexes that need to be adjusted are {5, 6, 7, 8} that is shown by 604 in FIG. 6, and the adjustment sequence is {0, 1, 1, 4}. The adjustment sequence may be understood as offsets (the offset may be a positive integer, 0, or a negative integer) of four indexes that need to be adjusted. As shown in FIG. 6, an index 5 corresponds to an adjustment offset 0, which indicates that a position of the index 5 does not need to be adjusted. An index 6 corresponds to an adjustment offset 1, which indicates that a position of the index 6 needs to be moved 1 bit backward. An index 7 corresponds to an adjustment offset 1, which indicates that a position of the index 7 needs to be moved 1 bit backward. An index 8 corresponds to an adjustment offset 4, which indicates that a position of the index 8 needs to be moved 4 bits backward. After the moving, a position of {5, 6, 7, 8} is shown by 606 in FIG. 6.

Figure 7:
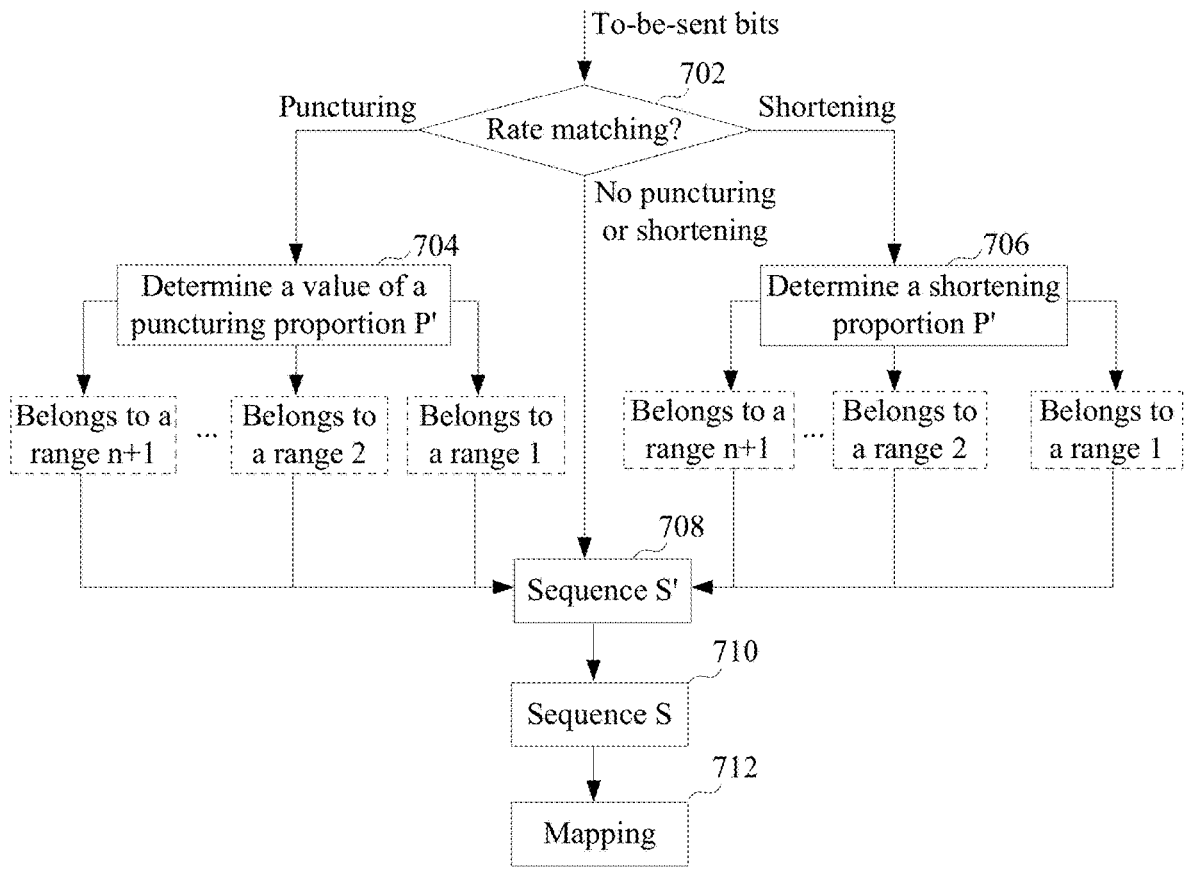
FIG. 7 is a flowchart of performing an adjustment method by a wireless device, according to an embodiment of the present application.

When the wireless device already stores a correspondence in any one of the foregoing Table 1 to Table 5, after receiving to-be-transmitted bits, the wireless device adjusts the sequence S based on rate matching, to form the final constructed sequence S. The following describes a procedure of the wireless device. For details, refer to FIG. 7.

702. After receiving to-be-transmitted bits, the wireless device determines whether to perform rate matching. If the rate matching is not required, for example, puncturing or shortening is not required, go to step 708. If the rate matching is required, the wireless device further determines a rate matching manner. If a puncturing manner is used, go to step 704; if a shortening manner is used, go to step 706.

704. Determine a value of a puncturing proportion P'.

706. Determine a value of a shortening proportion P'. (For ease of description, both the shortening proportion and the puncturing proportion are represented by P'. In actual applications, however, the two values may be different, and correspondences between P' and S' may be different.)

If the wireless device stores a correspondence between P' and S' by using a form shown in Table 2 or 3, in step 704 or 706, the wireless device may further determine a range to which P' belongs.

708. Obtain a corresponding sequence S' based on the value of P'.

The wireless device already stores the correspondence between P' and S', for example, as shown in any one of Table 1 to Table 5, and the wireless device may find, by querying the table, the sequence S' corresponding to P'.

710. The wireless device obtains, based on the sequence S', a constructed sequence S that has a length of M.

How to obtain, based on the sequence S', the constructed sequence S that has the length of M is described above. For details, refer to corresponding parts in FIG. 5 or FIG. 6. Details are not described herein again.

712. The wireless device maps the to-be-transmitted bit sequence to subchannels corresponding to the constructed sequence S.

The embodiments of the present application further provide a method for extracting a short sequence from a long sequence. This method may be applied to extracting a constructed sequence S that has a length of M from a sequence S'. The length of the long sequence may be an integral power of 2 or may not be an integral power of 2.

For non-mother code sequences, i.e. target sequences, code length $M_1$ of a first sequence and code length $M_2$ of a second sequence satisfy $M_2=(2n) \times M_1$. For example, a code length $M_1$ of a 5G NR (new radio) PDCCH (Physical Downlink Control Channel) may be a fixed value of 96, 192, 384, or 768. A target sequence that has a largest code length and that meets a nested feature may also be constructed, and an extracting manner is similar to the extracting manner (namely, manner (1) in step 410) of the largest mother code sequence. For non-mother code sequences, puncturing or shortening positions for different code lengths need to meet symmetry shown in FIG. 11A or 11B.

Figure 11A:
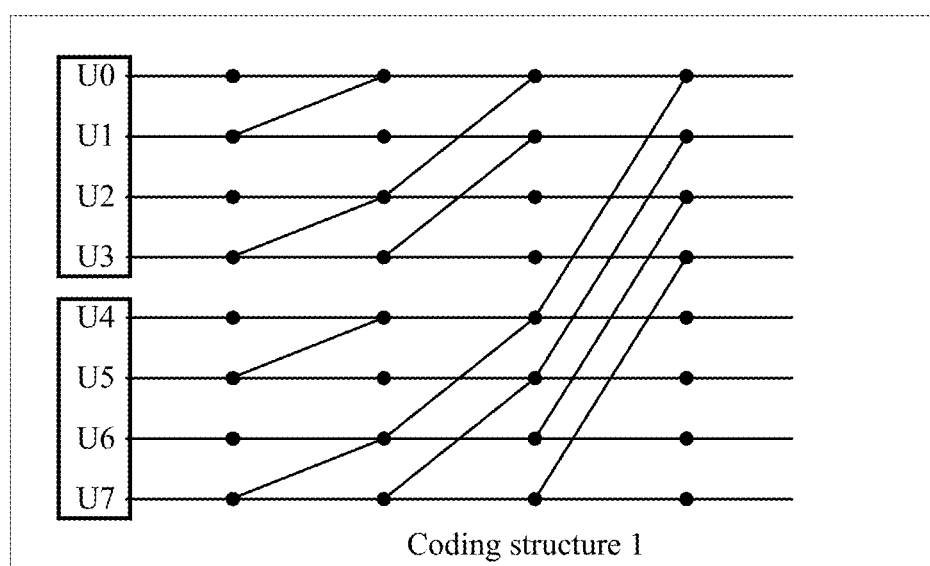
FIG. 11A and FIG. 11B are schematic diagrams of coding structures, according to an embodiment of the present application.

According to symmetry of a coding structure shown in FIG. 11A,

A rated matched sequence of $M_1=96$ is obtained by puncturing or shortening an output sequence of $N_1=128$, and a set of puncturing or shortening positions is $\{P_1, P_2, \ldots, P_{32}\}$;

A rated matched sequence of $M_2=192$ is obtained by puncturing or shortening an output sequence of $N_2=256$, and a set of puncturing or shortening positions is $\{P_1, P_2, \ldots, P_{32}, P_{1+128}, P_{2+128}, P_{32+128}\}$; and A rated matched sequence of $M_3=384$ is obtained by puncturing or shortening an output sequence of $N_3=512$, and a set puncturing or shortening positions is $\{P_1, P_2, \ldots, P_{32}, P_{1+128}, P_{2+128}, \ldots, P_{32+128}, P_{1+256}, P_{2+256}, \ldots, P_{32+256}, P_{1+384}, P_{2+384}, \ldots, P_{32+384}\}$.

Figure 11B:
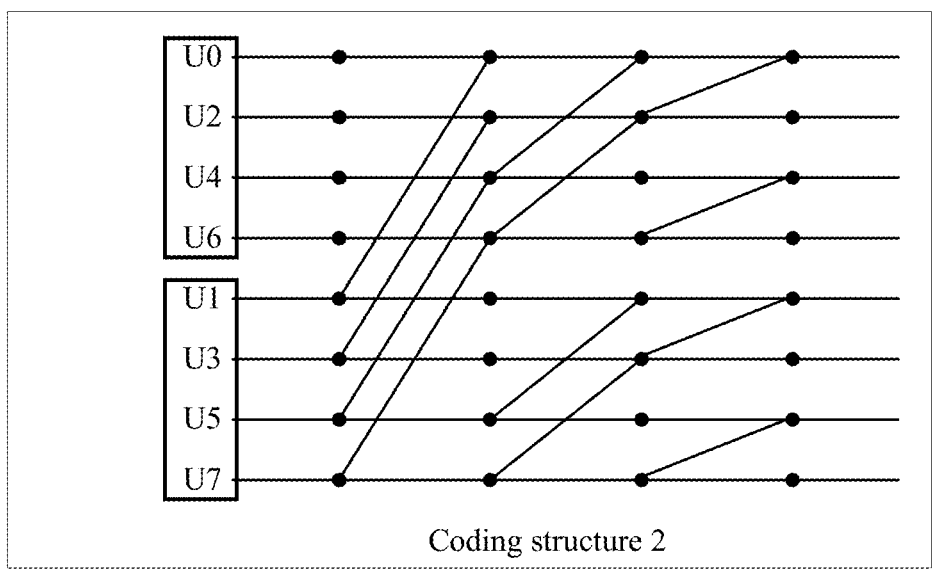

According to symmetry of a coding structure shown in FIG. 11B,

A rated matched sequence of $M_1=96$ is obtained by puncturing or shortening an output sequence of $N_1=128$, and a set of puncturing or shortening positions is $\{P_1, P_2, \ldots, P_{32}\}$;

A rated matched sequence of $M_2=192$ is obtained by puncturing or shortening an output sequence of $N_2=256$, and a set of puncturing or shortening positions is $\{P_1, P_2, \ldots, P_{32}, P_{1+1}, P_{2+1}, \ldots, P_{32+1}\}$; and A rated matched sequence of $M_3=384$ is obtained by puncturing or shortening a mother code sequence of $N_3=512$, and a set of puncturing or shortening positions is $\{P_1, P_2, \ldots, P_{32}, P_{1+1}, P_{2+1}, \ldots, P_{32+1}, P_{1+2}, P_{2+2}, \ldots, P_{32+2}, P_{1+3}, P_{2+3}, \ldots, P_{32+3}\}$.

Figure 8:
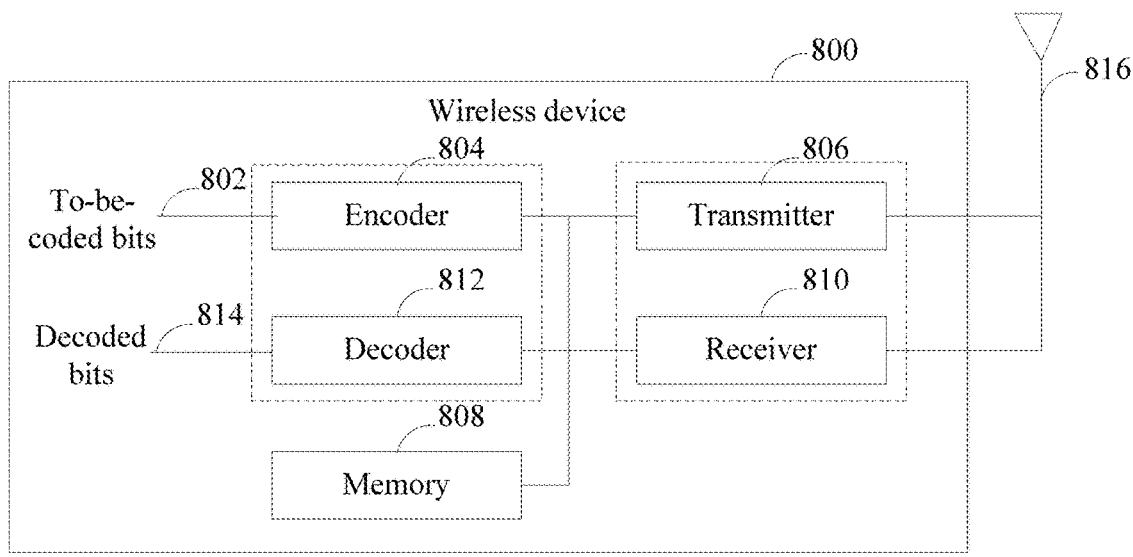
FIG. 8 is a simplified structural diagram of a wireless communication device according to an embodiment of the present application.

FIG. 8 is a schematic block diagram of a wireless device according to an embodiment of the present application. As shown in FIG. 8, a wireless device 800 includes at least an encoder 804 and a memory 808.

The memory 808 is configured to store a correspondence between a puncturing/shortening proportion P' and a sequence S'.

The encoder 804 is configured to: obtain, based on the correspondence, stored in the memory, between the puncturing/shortening proportion P' and the sequence S', a constructed sequence S that has a length equal to a target code length M, where S' includes N' channel indexes sorted by channel reliability or channel capacity, and sorting of channel indexes in S is the same as or different from sorting of channel indexes in S'; and map a to-be-transmitted bit sequence to a channel corresponding to S.

Functions of the encoder 804 may be implemented by using a chip or an integrated circuit. If the functions of the encoder 804 are implemented by using a chip, the wireless device 800 may further include an interface 802. The encoder 804 is configured to obtain a to-be-transmitted bit sequence by using the interface 802, and the encoder 804 performs polar coding on the to-be-transmitted bit sequence to obtain an output bit sequence. The encoder may perform some or all of steps 302 to 304, or some or all of steps 402 to 410, or steps 702 to 712.

When performing steps 302 to 304, 402 to 410, or 702 to 712, the chip may be implemented by using a logic circuit or by using a processor, or implemented partially by using a logic circuit and partially by using a processor. If steps 302 to 304, 402 to 410, or 702 to 712 are implemented by using a processor, the memory 808 may store program code that is used to implement some or all of steps 302 to 304, 402 to 410, or 702 to 712. When executing the program code, the processor performs some or all of steps 302 to 304, 402 to 410, or 702 to 712. The memory 808 may be integrated inside a chip or may be disposed outside a chip.

For details about how to obtain a constructed sequence S from a sequence that has a length of S', refer to the foregoing description. Details are not described herein again.

The wireless device 800 may further include a transmitter 806, configured to send the bit sequence that is mapped by the encoder 804 to the channel corresponding to S.

The wireless device 800 may further include an antenna 816. The transmitter 806 is configured to send, by using the antenna 816, a bit sequence that is output by the encoder. If the wireless device is a terminal, the antenna 816 is probably integrated in the terminal. If the wireless device is a network device, the antenna 816 may be integrated in the network device, or may be separate from the network device, for example, the antenna 816 is connected to the network device in a remote manner.

In addition, the wireless device may further include a receiver 810, configured to receive information or data from another wireless device. A decoder 812 is configured to: obtain, based on the puncturing/shortening proportion P' and a prestored sequence S', the constructed sequence S that has the length equal to the target code length M, use the constructed sequence to decode the to-be-decoded bits, and then output decoded bits by using an interface 814. A method for obtaining, by the decoder, S based on S' is the same as that used on an encoder side. For details, refer to the description in the foregoing method embodiments. Details are not described herein again.

In actual applications, the encoder 804 and the decoder 812 may be integrated together to form a codec or a codec apparatus, and the transmitter 806 and the receiver 810 may be integrated together to form a transceiver.

An embodiment of the present application further provides a chip. The chip includes at least the foregoing interface 802 and the encoder 804.

An embodiment of the present application further provides a computer storage medium. The storage medium stores program code that is used to implement steps 302 to 304, 402 to 410, or 702 to 712.

According to the foregoing technical solutions provided in this application, a constructed sequence that is suitable for various puncturing/shortening proportions may be generated, and channel reliability sorting in the constructed sequence is more appropriate, thereby decreasing a bit error rate.

An embodiment of the present application further provides an encoder, configured to perform the method corresponding to FIG. 11A or FIG. 11B. The encoder may be applied to the wireless device shown in FIG. 8.

The storage medium includes various media that can store program code, such as a USB flash drive, a removable hard disk, a read-only memory (ROM), a random access memory (RAM), a magnetic disk, or an optical disc.

An embodiment of the present application further provides a computer program product. The computer program product includes program code that is used to implement steps 302 to 304, 402 to 410, or 702 to 712. The computer program product may be stored in the storage medium, or on a server, for download by a user.

Connection relationships between components or integral units mentioned in the foregoing embodiments may be direct connections or coupling, or may be indirect connections or coupling. Between two components or integral units, there may be another component or integral unit, which is not particularly related to the solutions of the embodiments of the present application, and therefore is not shown in the figures.

According to the foregoing embodiments, the wireless device or the wireless communication system only needs to store a long sequence, and during coding, reads, from the long sequence, a mother code sequence having a length required for coding, thereby decreasing storage overheads of the wireless device or the system.

What is claimed is:

1. A method for coding information, comprising:
    obtaining, by a communication device, one or more to-be-coded information bits;
    coding, by the communication device, the to-be-coded information bits in a polar coding process, to obtain a polar-coded bit sequence of N' bits, wherein N' is an integer power of 2, and N' is greater than to a target code length M;
    obtaining, by the communication device, based on a puncturing/shortening proportion P' and a prestored sequence S', a sequence S that has a length equal to the target code length M, wherein the sequence S' comprises N' channel indexes sorted by channel reliability or channel capacity, and a sorting order of channel indexes in the sequence S is relatively the same as a sorting order of channel indexes in the sequence S'; and
    outputting, by the communication device, a rate matched bit sequence by rate matching the polar-coded bit sequence, wherein the rate matched bit sequence comprises M bits from the polar-coded bit sequence, and the M bits from the polar-coded bit sequence correspond to M channel indexes in the sequence S;
    wherein when the quantities N' and M satisfy:

$$N' \times 3/4 < M \leq \beta \times (N' \times 3/4), \text{ where } \beta > 1$$

subchannels corresponding to channel indexes that are less than N'/4 in the prestored channel index sequence S' are frozen.

2. The method according to claim 1, wherein $\beta=(1+1/16)$, $\beta=(1+1/8)$ or $\beta=(1+3/16)$.

3. The method according to claim 1, wherein the sequence S is obtained, after N' × P' channels are removed from N' channels corresponding to the sequence S', by adjusting indexes of remaining N'×(1−P') channels based on a preset adjustment sequence, and the sequence S comprises some or all of the indexes of the remaining N'×(1−P') channels.

4. The method according to claim 3, wherein the adjustment sequence is an all-zero sequence.

5. The method according to claim 1, wherein the sequence S' is one of a plurality of sequences, and each of the plurality of sequences corresponds to one puncturing/shortening proportion.

6. The method according to claim 1, wherein the polar coding process is represented by the following formula:

$$x_1^{N'} = u_1^{N'} G_{N'}$$

wherein $x_1^{N'}$ is the polar-coded bit sequence, $u_1^{N'} G_{N'}$ an N-bit binary row vector comprising the to-be-coded bits, and $G_{N'}$ is a generator matrix of N' rows×N' columns.

7. A communication apparatus, comprising:
    a memory and a processor;
    wherein the memory is configured to prestore a channel index sequence S', and the processor is configured to:
    obtain one or more to-be-coded information bits;
    code the to-be-coded information bits in a polar coding process, to obtain a polar-coded bit sequence of N' bits, wherein N' is an integer power of 2, and N' is greater than a target code length M;
    obtain, based on a puncturing/shortening proportion P' and the prestored sequence S', a sequence S that has a length equal to the target code length M, wherein the sequence S' comprises N' channel indexes sorted by channel reliability or channel capacity, and sorting of channel indexes in the sequence S is relatively the same as sorting of channel indexes in the sequence S'; and
    output a rate matched bit sequence by rate matching the polar-coded bit sequence, wherein the rate matched bit sequence comprises M bits from the polar-coded bit sequence, and the M bits from the polar-coded bit sequence correspond to M channel indexes in the sequence S;
    wherein when the quantities N' and M satisfy:

$$N' \times 3/4 < M \leq \beta \times (N' \times 3/4), \text{ where } \beta > 1$$

subchannels corresponding to channel indexes that are less than N'/4 in the prestored channel index sequence S' are frozen.

8. The apparatus according to claim 7, wherein $\beta=(1+1/16)$, $\beta=(1+1/8)$ or $\beta=(1+3/16)$.

9. The apparatus according to claim 7, wherein the sequence S is obtained, after N'×P' channels are removed from N' channels corresponding to the sequence S', by adjusting indexes of remaining N'×(1−P') channels based on a preset adjustment sequence, and the sequence S comprises some or all of the indexes of the remaining N'×(1−P') channels.

10. The apparatus according to claim 9, wherein the adjustment sequence is an all-zero sequence.

11. The apparatus according to claim 7, wherein the sequence S' is one of a plurality of sequences, and each of the plurality of sequences corresponds to one puncturing/shortening proportion.

12. The apparatus according to claim 7, wherein the polar coding process is represented by the following formula:

$$x_1^{N'}=u_1^{N'}G_{N'}$$

wherein $x_1^{N'}$ is the polar-coded bit sequence, $u_1^{N'}$ is an N'-bit binary row vector comprising the to-be-coded bits, and $G_{N'}$ is a generator matrix of N' rows×N' columns.

13. An apparatus, comprising one or more integrated circuits forming an interface and an encoder, wherein the encoder is configured to:
   obtain one or more to-be-coded information bits;
   encode the to-be-coded information bits in a polar coding process, to obtain a polar-coded bit sequence of N' bits, wherein N' is an integer power of 2, and N' is greater than a target code length M;
   obtain, based on a puncturing/shortening proportion P and a prestored sequence S', a sequence S that has a length equal to the target code length M, wherein the sequence S' comprises N' channel indexes sorted by channel reliability or channel capacity, and sorting of channel indexes in the sequence S is relatively the same as sorting of channel indexes in the sequence S'; and
   output a rate matched bit sequence by rate matching the polar-coded bit sequence, wherein the rate matched bit sequence comprises M bits from the polar-coded bit sequence, and the M bits from the polar-coded bit sequence correspond to M channel indexes in the sequence S;

wherein when the quantities N' and M satisfy:

$$N' \times 3/4 < M < \beta \times (N' \times 3/4), \text{ where } \beta > 1$$

subchannels corresponding to channel indexes that are less than N'/4 in the prestored channel index sequence S' are frozen.

14. The apparatus according to claim 13, wherein $\beta=(1+1/16)$, $\beta=(1+1/8)$ or $\beta=(1+3/16)$.

15. The apparatus according to claim 13, wherein the sequence S is obtained, after N'×P' channels are removed from N' channels corresponding to the sequence S', by adjusting indexes of remaining N'×(1−P') channels based on a preset adjustment sequence, and the sequence S comprises some or all of the indexes of the remaining N'×(1−P') channels.

16. The apparatus according to claim 15, wherein the adjustment sequence is an all-zero sequence.

17. The apparatus according to claim 13, wherein the sequence S' is one of a plurality of sequences, and each of the plurality of sequences corresponds to one puncturing/shortening proportion.

18. The apparatus according to claim 13, wherein the polar coding process is represented by the following formula:

$$x_1^{N'}=u_1^{N'}G_{N'}$$

wherein $x_1^{N'}$ is the polar-coded bit sequence, $u_1^{N'}$ is an N-bit binary row vector comprising the to-be-coded bits, and $G_{N'}$ is a generator matrix of N' rows×N' columns.

* * * * *

UNITED STATES PATENT AND TRADEMARK OFFICE
CERTIFICATE OF CORRECTION

PATENT NO. : 11,133,829 B2
APPLICATION NO. : 16/805701
DATED : September 28, 2021
INVENTOR(S) : Huazi Zhang et al.

Page 1 of 1

It is certified that error appears in the above-identified patent and that said Letters Patent is hereby corrected as shown below:

In the Claims

Claim 1, Column 14, Line 2: "where $\beta>1$" should read "where $\beta>1$,"

Claim 6, Column 14, Line 25: "$u_1^{N'}G_{N'}$an" should read "$u_1^{N'}$" is an"

Claim 7, Column 14, Line 53: "where $\beta>1$" should read "where $\beta>1$,"

Claim 13, Column 15, Line 20: "proportion P and" should read "proportion P' and"

Claim 13, Column 16, Line 2: "where $\beta>1$" should read "where $\beta>1$,"

Signed and Sealed this
Thirtieth Day of November, 2021

Drew Hirshfeld
*Performing the Functions and Duties of the*
*Under Secretary of Commerce for Intellectual Property and*
*Director of the United States Patent and Trademark Office*